US012643829B2

(12) United States Patent　　　　(10) Patent No.:　US 12,643,829 B2

Read et al.　　　　　　　　　　　　　(45) Date of Patent:　Jun. 2, 2026

(54) PARTICLE ENHANCEMENT OF CERAMIC MATRIX COMPOSITES, METHOD OF MANUFACTURE THEREOF AND ARTICLES COMPRISING THE SAME

(71) Applicant: Raytheon Technologies Corporation, Farmington, CT (US)

(72) Inventors: Kathryn S. Read, Marlborough, CT (US); Tyler G. Vincent, Portland, CT (US); Richard Wesley Jackson, III, Mystic, CT (US)

(73) Assignee: RTX CORPORATION, Farmington, CT (US)

( * ) Notice: Subject to any disclaimer, the term of this patent is extended or adjusted under 35 U.S.C. 154(b) by 502 days.

(21) Appl. No.: 18/084,002

(22) Filed: Dec. 19, 2022

(65) Prior Publication Data

US 2023/0192563 A1　Jun. 22, 2023

Related U.S. Application Data

(60) Provisional application No. 63/291,763, filed on Dec. 20, 2021.

(51) Int. Cl.
| | |
|---|---|
| *C04B 35/80* | (2006.01) |
| *C04B 35/628* | (2006.01) |
| *C04B 35/657* | (2006.01) |
| *C23C 16/04* | (2006.01) |
| *C23C 16/32* | (2006.01) |

(52) U.S. Cl.
CPC ........ *C04B 35/80* (2013.01); *C04B 35/62863* (2013.01); *C04B 35/62884* (2013.01); *C04B 35/62886* (2013.01); *C04B 35/62892* (2013.01); *C04B 35/62894* (2013.01); *C04B 35/657* (2013.01); *C23C 16/045* (2013.01); *C23C 16/325* (2013.01); *C04B 2235/3826* (2013.01); *C04B 2235/404* (2013.01); *C04B 2235/408* (2013.01); *C04B 2235/5244* (2013.01); *C04B 2235/5252* (2013.01); *C04B 2235/614* (2013.01); *C04B 2235/616* (2013.01); *C04B 2235/9607* (2013.01)

(58) Field of Classification Search
None
See application file for complete search history.

(56) References Cited

U.S. PATENT DOCUMENTS

| | | | |
|---|---|---|---|
| 5,203,873 | A | 4/1993 | Corsmeier et al. |
| 5,389,450 | A | 2/1995 | Kennedy et al. |
| 6,418,973 | B1 | 7/2002 | Cox et al. |
| 8,456,968 | B1 | 6/2013 | Sasaki et al. |
| 8,545,938 | B2 | 10/2013 | Schmidt et al. |
| 10,508,058 | B2 | 12/2019 | Kalo |
| 10,562,825 | B2 | 2/2020 | Sheedy et al. |
| 10,563,523 | B2 | 2/2020 | Schetzel |
| 10,822,281 | B2 | 11/2020 | She et al. |
| 10,829,419 | B2 | 11/2020 | Jackson et al. |
| 11,046,615 | B2 | 6/2021 | Tang et al. |
| 2010/0015396 | A1* | 1/2010 | Johnson ............... C04B 35/573 |
| | | | 428/338 |
| 2012/0076927 | A1 | 3/2012 | Bhatt et al. |
| 2015/0328799 | A1 | 11/2015 | Szweda et al. |
| 2017/0057879 | A1 | 3/2017 | Harris et al. |
| 2018/0215733 | A1 | 8/2018 | Austad et al. |
| 2020/0181029 | A1 | 6/2020 | Clerambourg et al. |
| 2020/0255729 | A1 | 8/2020 | Okuno et al. |
| 2021/0147303 | A1 | 5/2021 | Bortoluzzi et al. |
| 2021/0163366 | A1 | 6/2021 | Clerambourg et al. |
| 2021/0276922 | A1 | 9/2021 | Tang et al. |

FOREIGN PATENT DOCUMENTS

| | | |
|---|---|---|
| CN | 106966741 A | 7/2017 |
| CN | 113185299 A | 7/2021 |
| EP | 3241815 A1 | 11/2017 |
| JP | 2020132470 A | 8/2020 |
| WO | 2022266445 A1 | 12/2022 |
| WO | 2022266446 A1 | 12/2022 |

OTHER PUBLICATIONS

International Search Report for International Application No. PCT/US2022/053358; International Filing date Dec. 19, 2022; Report Mail Date May 4, 2023; 4 pages.
Written Opinion for International Application No. PCT/US2022/053358; International Filing date Dec. 19, 2022; Report Mail Date May 4, 2023; 7 pages.
Search Report issued in European Patent Application No. 22912345.0; Date of Mailing Dec. 4, 2025 (10 pages).

* cited by examiner

*Primary Examiner* — Cheng Yuan Huang
(74) *Attorney, Agent, or Firm* — CANTOR COLBURN LLP

(57) ABSTRACT

Disclosed herein is a ceramic matrix composite comprising a preform comprising a plurality of plies; a ceramic matrix encompassing the plies and distributed through the plies; and thermally conducting particles distributed through the ceramic matrix. Disclosed herein is a method comprising distributing thermally conducting particles between plies in a preform; infiltrating chemical vapors of a ceramic precursor into the plies; and reacting the ceramic precursor to form a matrix.

20 Claims, 4 Drawing Sheets

12

Composition 1

Composition 1

Region 1'

Composition 2

Region 2'

12'

Composition 1

Composition 1

Region 1'

Composition 1 & 2

Region 2'

PARTICLE ENHANCEMENT OF CERAMIC MATRIX COMPOSITES, METHOD OF MANUFACTURE THEREOF AND ARTICLES COMPRISING THE SAME

CROSS-REFERENCE TO RELATED APPLICATIONS

This application claims the benefit of U.S. Provisional Application Ser. No. 63/291,763 filed Dec. 20, 2021, which is incorporated herein by reference in its entirety.

BACKGROUND

This disclosure relates to the particle enhancement of ceramic matrix composites, methods of manufacture thereof and articles comprising the same. In particular, this disclosure relates to the particle enhancement of ceramic matrix composites, which promotes a different heat distribution profile in the ceramic matrix composite.

Thermal management in all hot section engine components is important to the performance of the engine. Due to low interlaminar strength capabilities in 2D stacked ceramic matrix composite components, thermal gradients must be managed to prevent excessive thermally driven stresses, particularly in the thickness direction. Thermal conductivity of the substrate is therefore a driver of this thickness thermal gradient. Increasing material conductivity can help reduce thermal gradients. Depending on the type of component (i.e. BOAS, vane, or blade) and location on the component, external gas-path heat-loads can vary.

For example, at the leading edge (LE) of an airfoil, heat load is typically high, requiring increased cooling to limit part temperatures. Having a locally higher substrate conductivity would improve the efficiency of the cold-side cooling flow, simultaneously reducing maximum part temperatures and thermal gradients, ultimately reducing component stresses and increasing life. It is therefore desirable to improve the thermal conductivity of ceramic matrix composites used in hot section engine components.

BRIEF DESCRIPTION

Disclosed herein is a ceramic matrix composite comprising a preform comprising a plurality of plies; a ceramic matrix encompassing the plies and distributed through the plies; and thermally conducting particles distributed through the ceramic matrix.

In an embodiment, the plies comprise fibers that comprise silicon carbide (SiC), carbon (C), silicon oxycarbide (SiOC), silicon nitride ($Si_3N_4$), silicon carbonitride (SiCN), hafnium carbide (HfC), zirconium carbide (ZrC), tantalum carbide (TaC), silicon borocarbonitride (SiBCN) and silicon aluminum carbon nitride (SiAlCN).

In another embodiment, the plies comprise fibers that comprise silicon carbide.

In yet another embodiment, the ceramic matrix comprises silicon carbide.

In yet another embodiment, the ceramic matrix comprises SiC, $Al_2O_3$, BN, $B_4C$, $Si_3N_4$, $MoSi_2$, $SiO_2$, SiOC, SiNC, and/or SiONC.

In yet another embodiment, the thermally conducting particles have a thermal conductivity of greater than or equal to about 50 W/mK at 25° C.

In yet another embodiment, the thermally conducting particles have a thermal conductivity of less than or equal to about 25 W/mK at 25° C.

In yet another embodiment, the thermally conductive particles comprise diamond, graphite, SiC, $Si_3N_4$, AlN, BN, carbon nanotubes, buckeyeballs, carbon whiskers, metal nanorods, metal nanowhiskers, metal nanoparticles, micro-sized particles and whiskers, or a combination thereof.

In yet another embodiment, the metal used in the metal nanorods, metal nanowhiskers and metal nanoparticles comprises gold, silver, copper, tungsten, zinc, aluminum, or a combination thereof.

In yet another embodiment, the thermally conducting particles have a unimodal particle size distribution.

In yet another embodiment, the thermally conducting particles have a bimodal particle size distribution.

In yet another embodiment, the thermally conducting particles have a multimodal particle size distribution.

In yet another embodiment, the thermally conducting particles are in the form of spheres, platelets, rods, tubes, films, or a combination thereof.

In yet another embodiment, the thermally conducting particles are irregularly shaped.

Disclosed herein is a method comprising distributing thermally conducting particles between plies in a preform; infiltrating chemical vapors of a ceramic precursor into the plies; and reacting the ceramic precursor to form a matrix.

In yet another embodiment, the distribution of thermally conducting particles between the plies is accomplished by applying the particles to the plies in a form of a slurry.

In yet another embodiment, the applying of the particles to the plies in the form of the slurry is accomplished prior to the infiltration of chemical vapors.

In yet another embodiment, the thermally conductive particles comprise diamond, graphite, SiC, $Si_3N_4$, AlN, BN, carbon nanotubes, buckeyeballs, carbon whiskers, metal nanorods, metal nanowhiskers, metal nanoparticles or a combination thereof.

In yet another embodiment, the metal used in the metal nanorods, metal nanowhiskers and metal nanoparticles comprises gold, silver, copper, tungsten, zinc, aluminum, or a combination thereof.

In yet another embodiment, the thermally conducting particles are in the form of spheres, platelets, rods, tubes, films, or a combination thereof.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Disclosed herein is a ceramic matrix composite (CMC) that comprises a plurality of plies in which are disposed thermally conductive particles to conduct and to dissipate heat generated during the operation of components that the composite is used in. Ceramic particles can be utilized not only to fill the voids inherent in a CMC but also to improve the performance of the CMC by enabling localized regions with different thermal performance (and mechanical performance) characteristics.

Disclosed herein too is a method of adding different amounts of ceramic particles to different regions of a ceramic matrix component thereby developing different thermal properties at different regions of the composite thus improving performance and increasing the life cycle of the component. This method can be used to target different thermal properties (and hence mechanical properties) at different regions of the component by adjusting the composition at these different regions to be different from the average composition at other regions of the component.

Figure 1:
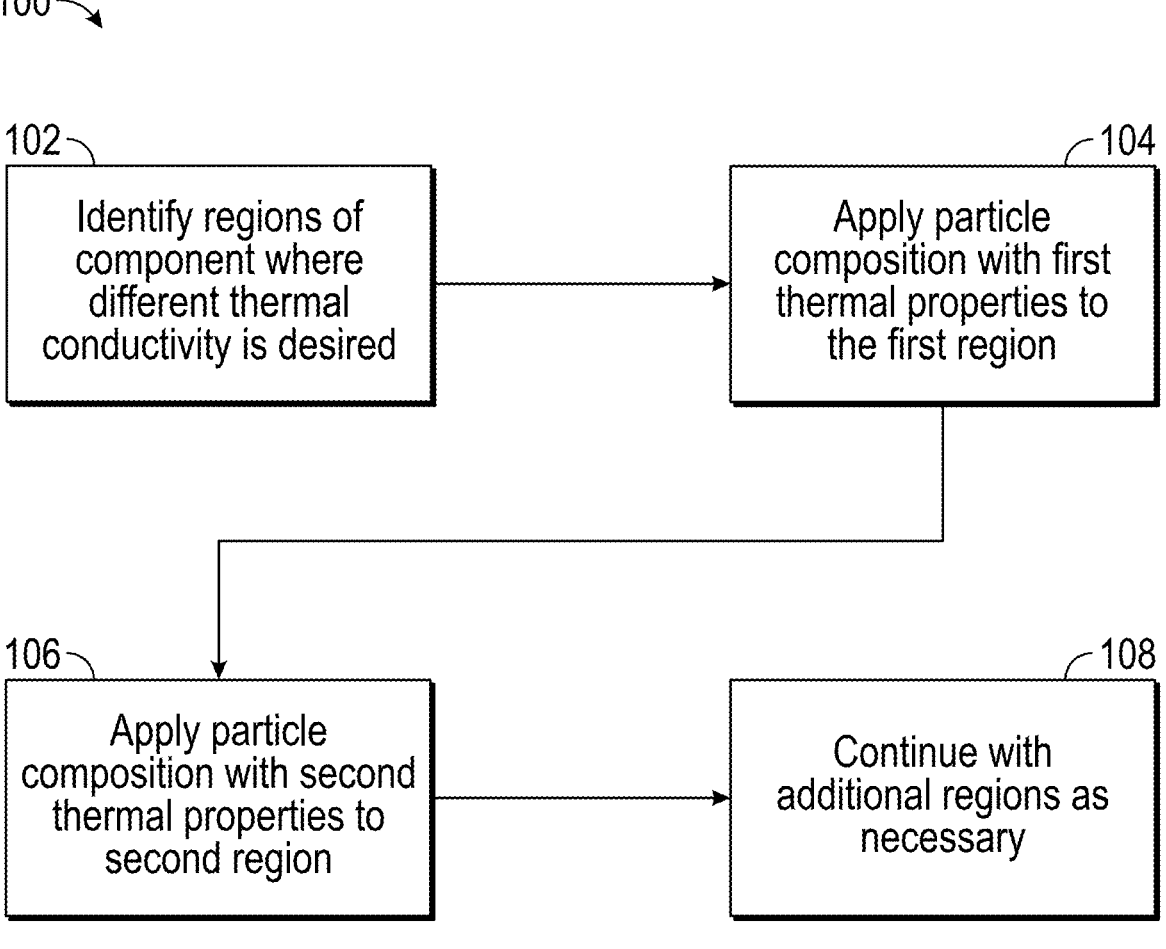
FIG. 1 is a depiction of a process for adding thermally conductive particles to a ceramic matrix composite.

With reference now to FIG. 1, a process 100 for adding thermally conductive particles to regions of a component for heat conduction or heat dissipation is disclosed. The process comprises determining which regions of a component (that comprises ceramic matrix composites) generate heat or are subjected to tremendous amounts of heat 102. For example, if the heat generated in a first region of a component is excessive and there is a rapid temperature build-up in that particular region, it may be desirable to add a first package of particles having a high thermal conductivity that can diffuse some of the heat generated at the first region to other regions of the component. On the other hand, if there is no particular heat handled by another adjacent region (a second region) of the component, it may be desirable to add the first package in such a manner that the heat generated in the first region is redistributed in such a manner that some of the heat generated in the first region is handled by the second region. Such rearranging of the heat profile in the component can increase the life span of the component while at the same time improving day to day performance.

As a result of determination of component performance made in step 102, a first package of heat conduction particles is added in a first step 104 to a first region to enhance heat conduction, while a second package of heat conduction particles is added in a second step 106 to a second region to enhance heat conduction. Additional packages (such as a third package of heat conduction particles, a fourth package of heat conduction particles, and so on) may be added 108 to different regions of the component depending upon the desired amount of heat conduction. These particles are all added to the preform prior to subjecting the perform to infusion by precursor molecules that are then densified to form a ceramic matrix. It is to be noted that the heat conduction particles may not only have a high heat conduction capacity (greater than 50 watts per meter-Kelvin ((W/mK) when measured at 25° C.)) but may have a low heat conduction capacity (less than 25 W/mK when measured at 25° C.) depending upon the need to balance heat distribution and heat dissipation in the component during its operation as well as after operation.

High thermal conductivity particles can include fillers having a particle shape, fibrous particles, or combinations thereof. High thermal conductivity particles of interest include diamond, graphite, zirconium carbide (ZrC), SiC, $Si_3N_4$, AlN, BN, boron phosphide (PB), carbon nanotubes, buckeyeballs, carbon whiskers, metallic nanorods, nanowhiskers, metal particles such as for example, silver, gold, copper, tungsten, aluminum, zinc, or the like, or a combination thereof. It is desirable for the particles used in the thermal conductivity package to not adversely effect (e.g., via catalytic action or the like) the ceramic matrix or the ceramic fibers used in the ceramic matrix composite.

Low thermal conductivity particles include fillers such as amorphous silica (e.g., fumed silica, aerogels, or the like), polycrystalline silicon nanowire, stabilized tetragonal zirconia (7 wt. % yttria-zirconia), cubic zirconia (14 wt. % yttria-zirconia, yttrium zirconate $Y_4Zr_3O_{12}$, gadolinium zirconate $Gd_2Zr_2O_7$, lanthanum zirconate $La_2Zr_2O_7$, gadolinium apatite $(Ca_2Gd_8(SiO_4)_{6O2})$, monazite $(LaPO_4)$, and magnetoplumbite lanthanum hexaaluminate $(LaMgAl_{11}O_{19})$, or the like, or a combination thereof. In an embodiment, the high thermal conductivity particles may be combined with low thermal conductivity particles to form a composite package that may be added to the ceramic matrix composite component.

The particles can be in the form of spheres, platelets, whiskers, rods, tubes, films, or a combination thereof. In an embodiment, the particles can have irregular shapes. The particles preferably have average dimensions in the micrometer range (50 nanometers or larger) (referred to herein as micro-sized particles) or have average dimensions in the nanometer range (50 nanometers or less) (referred to herein as nanosized particles such as nanotubes, nanorods, nanoparticles, and the like). The average dimensions are determined via the radius of gyration and can be determined via light scattering, electron microscopy or atomic force microscopy. The particles may have a unimodal particle size distribution, a bimodal particle size distribution or a multimodal particle size distribution (greater than 2 particle size distributions). In applications where it is desirable to rapidly redistribute heat generated, a bimodal or multimodal particle size distribution is desirable.

The thermally conductivity particles (both the high and the low thermal conductive particles) preferably have aspect ratios of 1 or greater, preferably 5 or greater and more preferably 10 or greater. The aspect ratio is the length of the particle divided by the diameter of the particle. The particles preferably have an aspect ratio greater than 1 with a greater coefficient of thermal conductivity in the direction of the highest aspect ratio.

Figure 2A:
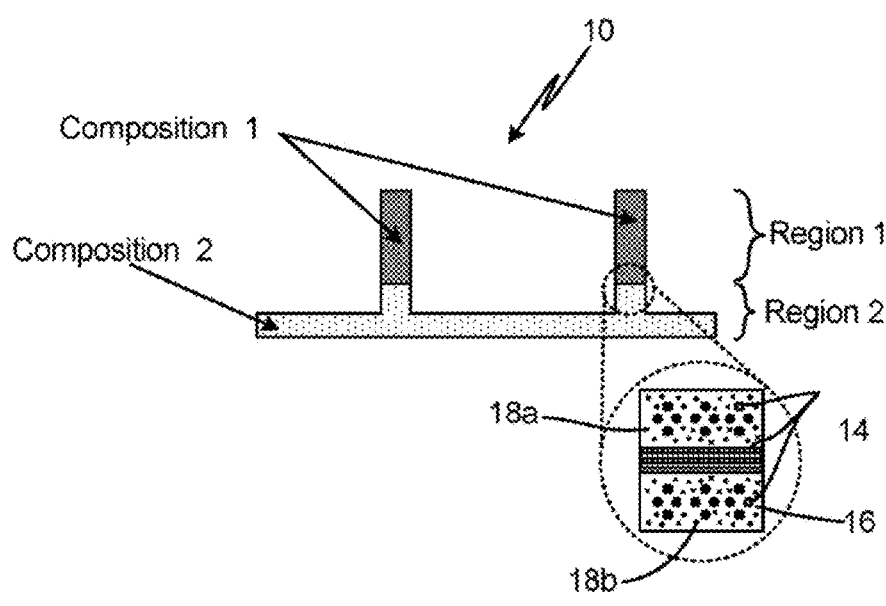
FIG. 2A illustrates a schematic cross-sectional view of components that form a blade outer air seal (BOAS) for use in a turbine section of a gas turbine engine.
Figure 2B:
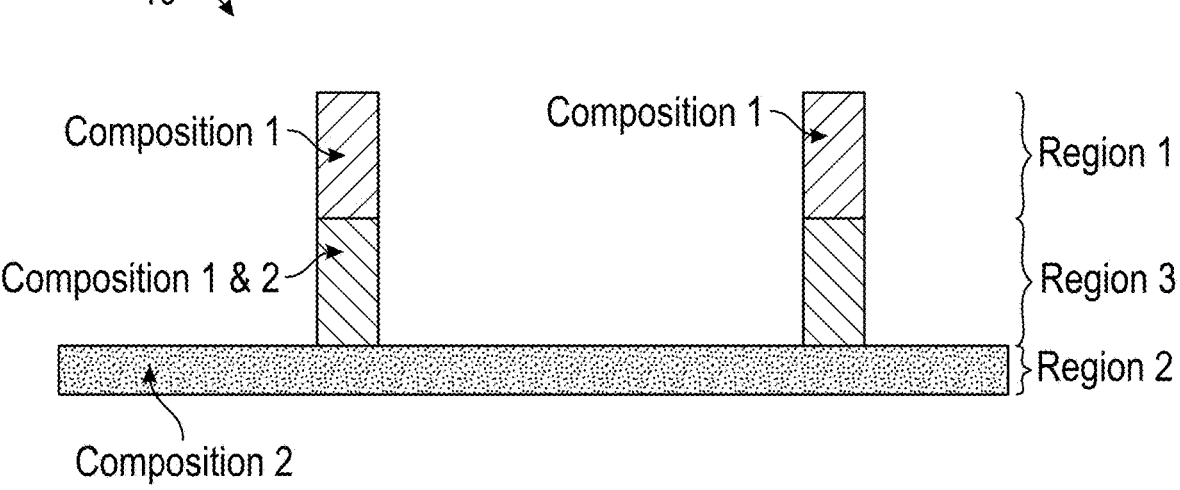
FIG. 2B illustrates another schematic cross-sectional view of components that form a blade outer air seal (BOAS) for use in a turbine section of a gas turbine engine.

FIGS. 2A and 2B depict exemplary schematic embodiments of the concept of variable application of ceramic particles (in a BOAS-like component) for thermal conductivity control. FIGS. 1A and 1B are cross-sectional schematic views of components 10 and 10', respectively. Components 10, 10' are formed from a CMC having tailored distributions of varying types of heat conducting particles.

Figure 3A:
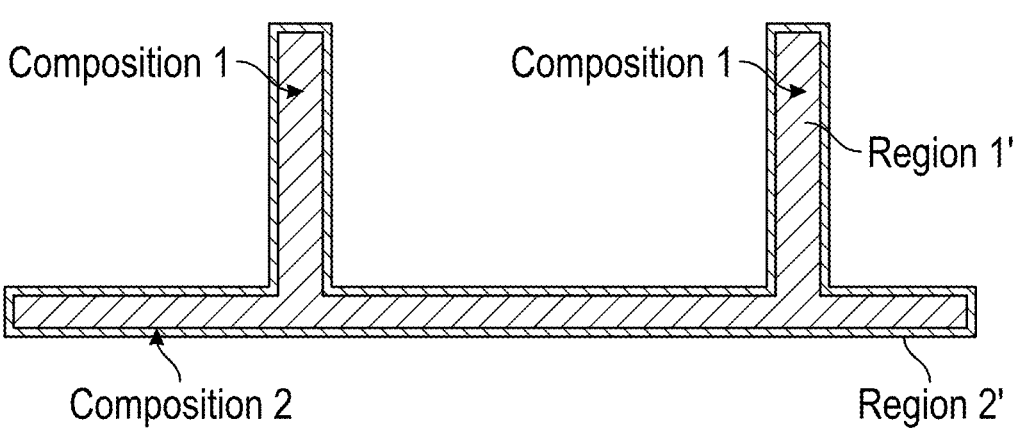
FIG. 3A illustrates another schematic cross-sectional views of components that form a blade outer air seal (BOAS) for use in a turbine section of a gas turbine engine.
Figure 3B:
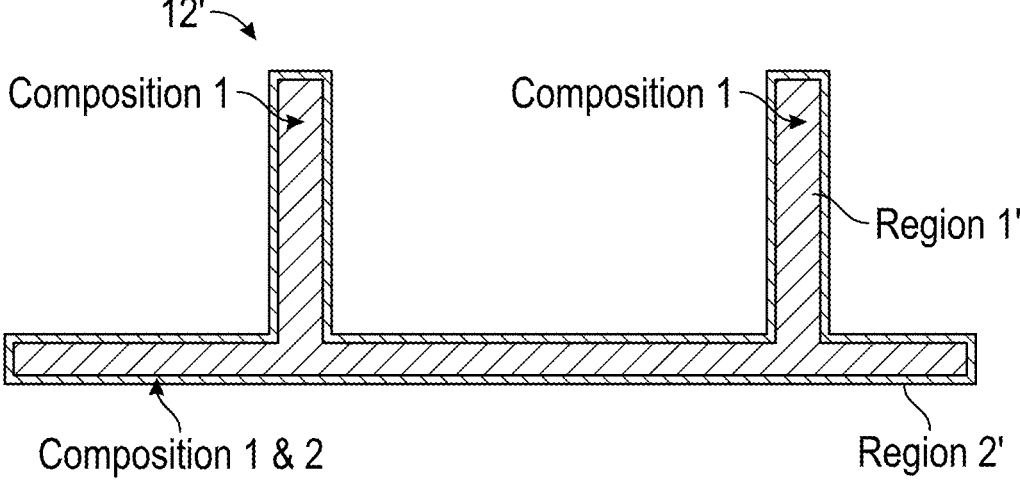
FIG. 3B illustrates another schematic cross-sectional views of components that form a blade outer air seal (BOAS) for use in a turbine section of a gas turbine engine.

FIGS. 3A and 3B are cross-sectional schematic views of components 12 and 12', respectively, which are formed from CMC having tailored distributions of varying types of heat conducting particles. FIGS. 2A, 2B, 3A, and 3B illustrate schematic cross-sectional views of components 10, 10', 12, 12', which are each examples of a blade outer air seal (BOAS) for use in a turbine section of a gas turbine engine. The BOAS was selected for illustrative purposes only and is intended merely to provide an example of a component that can be fabricated from CMC. It will be understood by one of ordinary skill in the art that the methods disclosed herein can be used in the fabrication of other components and are by no means limited to the manufacture of a BOAS. In other embodiments, components 10, 10', 12, 12' can be, for example, a blade, vane, or combustion liner as known in the art, or any other CMC component in a gas turbine engine.

Components 10, 10', 12, 12' can each be formed from a fiber-based ceramic preform comprising fibers or fiber tows, which can be woven, non-woven, or selectively placed. Exemplary fiber materials can include silicon carbide (SiC), carbon (C), silicon oxycarbide (SiOC), silicon nitride ($Si_3N_4$), silicon carbonitride (SiCN), hafnium carbide (HfC), zirconium carbide, (ZrC), tantalum carbide (TaC), silicon borocarbonitride (SiBCN), and silicon aluminum carbon nitride (SiAlCN). Exemplary matrix materials comprise SiC, $Al_2O_3$, BN, $B_4C$, $Si_3N_4$, $MoSi_2$, $SiO_2$, SiOC, SiNC, and/or SiONC.

In an embodiment, in order to facilitate effective heat conduction and distribution through a component, a matrix (of the ceramic matrix composite) can be formed from a mixture of a ceramic (e.g., SiC) and the heat conducting particles through a hybrid densification process that includes both CVI and slurry infiltration.

In the CVI process, a gaseous ceramic precursor, for example, methyl trichlorosilane (MTS), and a carrier gas (e.g., hydrogen ($H_2$)) diffuses into the porous preform, where the MTS reacts to form SiC. While this embodiment refers to SiC as an exemplary material for the matrix material, it will be understood that any ceramic precursor may be selected to form the ceramic matrix.

The ceramic is deposited inside the pores on the surface of the preform thereby densifying the preform with a ceramic matrix. CVI is a slow process and can result in the formation of large internal matrix pores, formed as outer pores are filled thereby preventing gas (precursor vapor) diffusion deeper into the preform.

In slurry infiltration, the ceramic and the heat conducting particles can be directly deposited in the preform, which can significantly accelerate the densification process and reduce the number of large pores formed. Particles can have the shapes detailed above. The size of particle can be tailored to ensure sufficient material deposition in all parts of the preform.

In some embodiments, particle radii can range in size from 0.25 micrometers for smaller particles up to 45 micrometers for large particles. Particles can be monomodal, bimodal or multimodal with respect to particle size distribution in the slurry. The CVI and slurry infiltration processes can be used repeatedly and in an alternating fashion in the fabrication process as needed to achieve a desired matrix densification. In some embodiments, the densification process can begin with CVI, followed by slurry infiltration. In alternative embodiments, slurry infiltration can be used prior to CVI for matrix densification. The addition of heat conducting particles can increase the surface area for CVI deposits, which may increase the rate of CVI densification. It can be preferable to use CVI in the final matrix densification step to ensure all accessible pores have been filled with the matrix material.

The ceramic (e.g., SiC) and heat conducting particles can be delivered to the preform as particle materials in a liquid slurry. The liquid slurry can be poured or injected into the preform. In some embodiments, the preform can be dipped to allow pickup of the ceramic and heat conducting particles and the liquid. In other embodiments, a combination of methods can be used to deliver the slurry to the preform in alternative steps or to different locations of the preform. The liquid can be water or aqueous-based, or an alcohol- or solvent-based non-aqueous fluid that is chemically compatible with the preform and the ceramic. The liquid can be removed through a single or iterative vacuum and/or drying processes prior to densification of the preform.

In some embodiments, the heat conducting particles can be mixed with a preceramic polymer to produce a polymer slurry, which can be delivered to the preform. The preceramic polymer can be retained in the preform and converted to a ceramic matrix phase after thermal processing in a manner consistent with polymer infiltration and pyrolysis (PIP) techniques.

The polymer slurry can be delivered to the preform in a manner similar to the aforementioned liquid slurry. In some embodiments, both liquid and polymer slurries can be used to deliver the ceramic and heat conducting particles to the preform. The slurry infiltration process can be conducted at normal pressure or can be vacuum- or pressure-assisted.

In some embodiments, the matrix can comprise up to 25 percent of heat conducting particles by volume. Preferably, the matrix can comprise between 5 and 15 percent of heat conducting particles by volume; however, it may be desirable to have a matrix comprising as low as 0.5 percent or as high as 25 percent of heat conducting particles by volume in certain applications.

In some embodiments, the concentration of heat conducting particles in the matrix can be substantially uniform throughout the component matrix. In other embodiments, the concentration of the heat conducting particles can vary depending on the location in the component.

For example, the concentration of heat conducting particles can be tailored to account for temperature variations in the component. Heat conducting particles near a surface or hot side of the component will be exposed to higher temperatures, which can facilitate more rapid heat conducting due to higher diffusion rates and reaction rates.

In contrast, heat conducting particles located in an inner region or on a cold side of the component can be exposed to lower temperatures and it may be desirable to use a lower percentage of heat conducting particles in this region as compared with a region that experiences higher temperatures. Generally, for slurry infiltration of the ceramic (e.g., SiC) and heat conducting particle materials, the total particle material in the slurry can comprise up to 30 percent heat conducting particles by volume with a remainder of ceramic to achieve a matrix composition of up to 25 percent heat conducting particles. Preferably, the total particle material in the slurry can comprise between 10 and 20 percent heat conducting particles by volume but can be as low as 0.5 percent and as high as 30 percent in some embodiments. The concentration of the heat conducting particles in the slurry can be varied to produce the desired matrix composition. Delivery of heat conducting particles in liquid and/or polymer slurries can provide for controlled and substantially uniform distribution of the heat conducting particles thereby enhancing the heat conducting capabilities of the matrix during operation.

In some embodiments, a slurry containing heat conducting particle material, alone or in combination with ceramic particles or a preceramic polymer, can be applied to a fiber ply or sheet (e.g., fiber cloth) prior to the preform layup process. Each fiber ply can be immersed in the slurry to coat the fibers prior to layup and thereby allow for selective placement of the heat conducting particles in the preform as the preform is being built. In some embodiments, the distribution and type of heat conducting particles can be tailored for each ply and thereby each region of component 10, 10', 12, and 12'.

With reference now to the FIGS. 2A and 2B, the heat conducting particles 18a and 18b in zones 14 and 16 may be applied to a cloth that is used to layup the preform, as in a pre-preg or they may be applied many other means of application including spray, dip coating, pipette, partial or full immersion. The ceramic particles may be applied in the preform state or in a state in which the CMC is partially dense with ceramic matrix. If the ceramic particles are applied in the preform state, they may be applied to each layer as the CMC preform is laid up. The preform can then be subjected to densification (where the matrix precursors react to form the matrix) entrapping the heat conducting particles in position.

FIGS. 2A, 2B, 3A, and 3B illustrate varying embodiments of selective deposition or location of self-healing additives in components 10, 10', 12, and 12'. The two categories of self-healing additives are illustrated as Composition 1 and Composition 2. Composition 1 and Composition 2 can be selected from amongst the heat conducting particles listed above (e.g., diamond, graphite, ZrC, SiC, $Si_3N_4$, AlN, BN, boron phosphide (BP), carbon nanotubes, buckeyeballs, carbon whiskers, metallic nanorods, nanowhiskers, metal particles such as for example, tungsten, molybdenum, iridium, niobium, tantalum, or the like, or a combination thereof), but are different from each other.

In some embodiments, multiple heat conducting particles (of different types) can be selected for each of Composition 1 and Composition 2 slurries (with Composition 1 and Composition 2 being different from each other) and can be selectively distributed to improve the heat conducting capabilities of the matrix. Composition 1 and Composition 2 compounds can retain their chemical composition through the CMC fabrication process. During operation, CMC components 10, 10', 12, 12' can be exposed to high temperatures and corrosive environments. After application of the respective compositions (Composition 1 or Composition 2) as detailed above, the precursors which may be in the form of vapors or slurries may be densified to form the ceramic matrix composite. Densification (which typically occurs as a result of a reaction between the precursors) may occur at temperatures greater than 1500° F.

Figure 4:
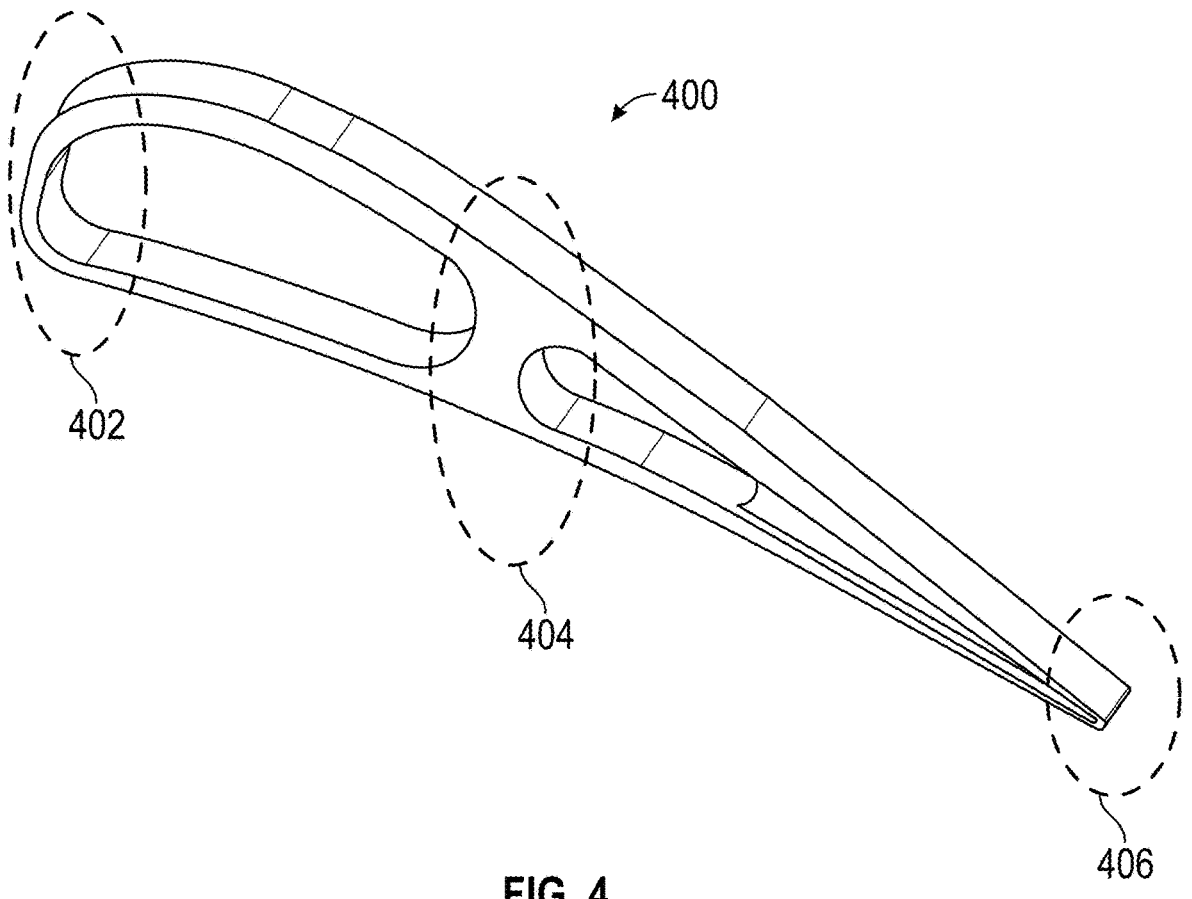
FIG. 4 is a graphical depiction of exemplary vane temperatures and interlaminar stresses.

FIG. 4 depicts an exemplary embodiment temperature distribution across a vane 400. Areas of concern are the leading edge (LE) 402, the ribs 404 and the trailing edge (TE) 406, where maximum temperature and/or interlaminar stresses may be limiting. This disclosure is directed at localized control of thermal conductivity to better control thermal gradients that can lead to undesirable thermal stresses, especially interlaminar stresses. In an embodiment, there is a higher heat load (and consequently higher temperatures) at the leading edge 402 of the vane 400 due to the high convection heat transfer resulting from the stagnation of a high speed fluid (e.g. air) onto the vane leading edge. The temperature at the leading edge is $T_1$. In order to mitigate the effects of the higher heat load at the leading edge, a greater amount of cooling fluid may be supplied to the leading edge 402. In cases where coolant is largely applied to the "coldside" or internal surface of the airfoil, a steeper through thickness temperature gradient is established. By adding heat conducting particles having a thermal conductivity of greater than 100 W/m-K to the leading edge of the vane 400, the temperature increase at the LE can be more evenly distributed throughout the vane leading edge volume, thereby mitigating some of the thru-thickness temperature gradients. In addition, by distributing thermally conductive particles having high thermal conductivity (greater than 100 W/m-K) through the thickness of the vane (at the leading edge), some of the temperature generated at the LE may be transferred rapidly through the thickness thus preventing the development of a steep thru-thickness gradient.

Similarly, at the rib 404 of the vane 400, high thermal gradients from gas-path to rib center can lead to high radial gradients in rib. During operation, the rib has a temperature $T_2$, where $T_2$ is greater than $T_1$. The addition of high thermal conductivity particles in this region would provide a higher conductivity, which would help alleviate the gradient by allowing more effective conduction of heat throughout the rib. In the vane embodiment shown, the trailing edge of a CMC vane can be difficult to manage maximum material temperatures due to its highly tapered geometry and high convective heat load. During operation, the trailing edge has a temperature $T_3$, where $T_3 > T_2 > T_1$. For trailing edges with dedicated cooling holes for thermal management, steep gradients can exist between cooling hole features. These cooling features can be either center discharge holes or pressure side film holes. By locally increasing thermal conductivity in the trailing edge region, the CMC substrate can more effectively conduct heat between these cooling features, reducing thermal gradients that can drive undesirable thermal stresses.

Higher thermal conductivity CMCs are advantageous in that they can enable a) reduction in film cooling flow that is used to control thermal gradients driving interlaminar stresses; and b) reduced component temperatures improving part life. This can facilitate the insertion of CMCs in more challenging operating conditions where an un-augmented component would have been limited either by maximum usage temperature or thermally driven stresses. An additional benefit which comes from the utilization of ceramic thermally conductive particles in a CMC is that they provide more surface area for matrix densification which reduces the total porosity of the CMC and further improves CMC interlaminar properties and increases thermal conductivity. The particles may additionally provide some surface roughness reduction if applied on outer layers of the part. Another embodiment of the invention would be to use higher temperature capable fibers (expensive) in external layer(s) with lower conductivity particle filler to act as a thermal resistance layer (low K, higher T).

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A ceramic matrix composite comprising:
a preform comprising a plurality of plies;
a ceramic matrix encompassing the plies and distributed through the plies; and
thermally conducting particles distributed through the ceramic matrix, wherein a first package of particles having a first thermal conductivity is distributed in a first region and a second package of particles having a second thermal conductivity is distributed in a second region, wherein the first thermal conductivity is greater than the second thermal conductivity and heat generated in the first region is distributed by the thermally conducting particles to the second region.

2. The ceramic matrix composite of claim 1, wherein the plies comprise fibers that comprise silicon carbide (SiC), carbon (C), silicon oxycarbide (SiOC), silicon nitride (Si$_3$N$_4$), silicon carbonitride (SiCN), hafnium carbide (HfC), zirconium carbide (ZrC), tantalum carbide (TaC), silicon borocarbonitride (SiBCN) and silicon aluminum carbon nitride (SiAlCN).

3. The ceramic matrix composite of claim 1, wherein the plies comprise fibers that comprise silicon carbide.

4. The ceramic matrix composite of claim 1, wherein the ceramic matrix comprises silicon carbide.

5. The ceramic matrix composite of claim 1, wherein the ceramic matrix comprises SiC, Al$_2$O$_3$, BN, B$_4$C, Si$_3$N$_4$, MoSi$_2$, SiO$_2$, SiOC, SiNC, and/or SiONC.

6. The ceramic matrix composite of claim 1, wherein the thermally conducting particles have a thermal conductivity of greater than or equal to about 50 W/mK measured at 25° C.

7. The ceramic matrix composite of claim 1, wherein the thermally conducting particles have a thermal conductivity of less than or equal to about 25 W/mK measured at 25° C.

8. The ceramic matrix composite of claim 1, wherein the thermally conductive particles comprise diamond, graphite, ZrC, SiC, Si$_3$N$_4$, AlN, BN, BP, carbon nanotubes, buckeyeballs, carbon whiskers, metallic particles, or a combination thereof.

9. The ceramic matrix composite of claim 8, wherein the metal used in the metallic particle comprises tungsten, molybdenum, iridium, niobium, tantalum or a combination thereof.

10. The ceramic matrix composite of claim 1, wherein the thermally conducting particles have a unimodal particle size distribution.

11. The ceramic matrix composite of claim 1, wherein the thermally conducting particles have a bimodal particle size distribution.

12. The ceramic matrix composite of claim 1, wherein the thermally conducting particles have a multimodal particle size distribution.

13. The ceramic matrix composite of claim 1, wherein the thermally conducting particles are in the form of spheres, platelets, rods, tubes, films, or a combination thereof.

14. The ceramic matrix composite of claim 1, wherein the thermally conducting particles are irregularly shaped.

15. A method comprising:
distributing thermally conducting particles between plies in a preform, wherein distributing the thermally conducting particles include a distributing first amount of particles at a first region generating a first amount of heat and distributing a second amount of particles at a second region generating a second amount of heat less than the first amount of heat so that the heat generated in the first region is redistributed to the second region;
dispersing a ceramic precursor through the preform; and
reacting the precursor to form a ceramic matrix.

16. The method of claim 15, wherein the distribution of thermally conducting particles between the plies is accomplished by applying the particles to the plies in a form of a slurry.

17. The method of claim 16, wherein the dispersing of the ceramic precursor through the preform is conducted via chemical vapor infiltration, polymer infiltration pyrolysis, melt infiltration, or a combination thereof.

18. The method of claim 16, wherein the thermally conductive particles comprise diamond, graphite, ZrC, SiC, Si$_3$N$_4$, AlN, BN, BP, carbon nanotubes, buckeyeballs, carbon whiskers, metal nanorods, metal nanowhiskers, metal nanoparticles or a combination thereof.

19. The method of claim 18, wherein the metal used in the metal particles comprises tungsten, molybdenum, iridium, niobium, tantalum, or a combination thereof.

20. The method of claim 16, wherein the thermally conducting particles are in the form of spheres, platelets, rods, tubes, films, or a combination thereof.

* * * * *